(12) United States Patent
Cruz-Albrecht et al.

(10) Patent No.: US 9,154,172 B1
(45) Date of Patent: Oct. 6, 2015

(54) TIME ENCODED CIRCUITS AND METHODS AND A TIME ENCODER BASED BEAMFORMER FOR USE IN RECEIVING AND TRANSMITTING APPLICATIONS

(71) Applicant: HRL LABORATORIES, LLC, Malibu, CA (US)

(72) Inventors: Jose Cruz-Albrecht, Oak Park, CA (US); Peter Petre, Oak Park, CA (US); Joseph F. Jensen, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/144,903

(22) Filed: Dec. 31, 2013

(51) Int. Cl.
*H04B 1/18* (2006.01)
*H03K 3/86* (2006.01)

(52) U.S. Cl.
CPC ... *H04B 1/18* (2013.01); *H03K 3/86* (2013.01)

(58) Field of Classification Search
USPC ............................................ 375/347; 341/138
See application file for complete search history.

(56) References Cited

U.S. PATENT DOCUMENTS

| | | | |
|---|---|---|---|
| 4,383,248 A | 5/1983 | Smith | |
| 4,939,515 A | 7/1990 | Adelson | |
| 5,185,715 A | 2/1993 | Zikan | |
| 5,345,398 A | 9/1994 | Lippmann | |
| 5,396,244 A | 3/1995 | Engel | |
| 5,479,170 A | 12/1995 | Cauwenbergh | |
| 5,490,062 A | 2/1996 | Leach | |
| 5,566,099 A | 10/1996 | Shimada | |
| 5,815,102 A | 9/1998 | Melanson | |
| 5,894,280 A | 4/1999 | Ginetti | |
| 5,910,763 A | 6/1999 | Flanagan | |
| 6,087,968 A | 7/2000 | Roza | |
| 6,111,531 A | 8/2000 | Farag | |
| 6,172,536 B1 | 1/2001 | Yoshihara | |
| 6,452,524 B1 | 9/2002 | Fraleigh | |
| 6,473,019 B1 | 10/2002 | Ruha | |
| 6,940,438 B2 | 9/2005 | Koe | |
| 6,975,682 B2 | 12/2005 | Cosand | |
| 7,038,608 B1 | 5/2006 | Gilbert | |
| 7,148,829 B2 * | 12/2006 | Inukai | 341/139 |
| 7,180,432 B2 | 2/2007 | Oliaei | |
| 7,253,761 B1 | 8/2007 | Hoyos | |
| 7,277,797 B1 | 10/2007 | Kunitsyn | |
| 7,324,035 B2 | 1/2008 | Harris | |
| 7,403,144 B1 | 7/2008 | Cruz-Albrecht | |
| 7,405,686 B2 | 7/2008 | Laroia | |
| 7,515,084 B1 | 4/2009 | Cruz-Albrecht | |
| 7,573,956 B2 | 8/2009 | Lazar et al. | |
| 7,583,213 B2 * | 9/2009 | Wang et al. | 341/139 |
| 7,592,939 B1 | 9/2009 | Cruz-Albrecht | |
| 7,724,168 B1 * | 5/2010 | Cruz-Albrecht et al. | 341/138 |
| 7,750,835 B1 | 7/2010 | Cruz-Albrecht | |
| 7,822,698 B1 | 10/2010 | Cruz-Albrecht | |
| 7,965,216 B1 | 6/2011 | Petre | |
| 7,996,452 B1 | 8/2011 | Cruz-Albrecht | |

(Continued)

OTHER PUBLICATIONS

U.S. Appl. No. 14/032,082, Cruz-Albrect, filed Sep. 19, 2013.

(Continued)

*Primary Examiner* — Jaison Joseph
(74) *Attorney, Agent, or Firm* — Ladas & Parry

(57) ABSTRACT

A method delaying a pulse domain signal using a time encoder circuit and a time encoder based beamformer method and apparatus for use in receiving and/or transmitting applications.

19 Claims, 12 Drawing Sheets

(56) References Cited

U.S. PATENT DOCUMENTS

| | | | |
|---|---|---|---|
| 8,169,212 | B2 | 5/2012 | Rivoir |
| 8,566,265 | B1 | 10/2013 | Cruz-Albrecht |
| 8,595,157 | B2 | 11/2013 | Cruz-Albrecht |
| 2005/0190865 | A1 | 9/2005 | Lazar |
| 2006/0087467 | A1 | 4/2006 | Itskovich |
| 2006/0092059 | A1* | 5/2006 | Guimaraes ............... 341/143 |
| 2007/0069928 | A1 | 3/2007 | Gehring |
| 2009/0303070 | A1 | 12/2009 | Zhang et al. |
| 2010/0225824 | A1 | 9/2010 | Lazar et al. |
| 2010/0321064 | A1* | 12/2010 | Mathe ......................... 326/59 |
| 2011/0028141 | A1* | 2/2011 | Yang et al. .............. 455/422.1 |
| 2012/0213531 | A1* | 8/2012 | Nazarathy et al. ......... 398/202 |

OTHER PUBLICATIONS

Author: Wikipedia; Title: "Relaxation oscillator"; URL: http://en.wikipedia.org/wiki/Relaxation_oscillator, Printed: Jun. 18, 2010 (6 pages).

Author: Wikipedia; Title: "Van der Pol oscillator"; URL: http://en.wikipedia.org/wiki/Van_der_Pol_osciliator, Printed: Jun. 18, 2010 (3 pages).

Cruz, J.M., et al, "A 16×16 Cellular Neural Network Universal Chip: The First Complete Single-Chip Dynamic Computer Array with Distributed Memory and with Gray Scale Input-Output," Analog Integrated Circuits and Signal Processing, 15, pp. 227-237, 1998.

Dighe, A.M., et al., "An Asynchronous Serial Flash Converter", 9th Int. Conf on Electronics, Circuits and Systems, IEEE, pp. 13-15, 2002.

Donoho, D. "Compressed Sensing", IEEE Transactions on Information Theory, vol. 52, No. 4, pp. 1289-1306, Apr. 2006.

Hasler et al., "VLSI Neural Systems and Circuits" 1990 IEEE, pp. 31-27.

Indiveri, Giacomo, "A Low-Power Adaptive Integrated-and-fire Neuron Circuit", IEEE International Symposium on Circuits and Systems, vol. IV, pp. 820-823, 2003.

Iwamoto, M. et al., "Bandpass Delta-Sigma Class-S Amplifier", Electronic Letters, vol. 36, No. 12, pp. 1010-1012, Jun. 2000.

Izhikevich, Eugene M., "Which Model to Use for Cortical Spiking Neurons?", IEEE Transactions on Neural Networks, vol. 15, No. 5, Sep. 2004, pp. 1063-1070.

Keane, J. and Atlas, L. "Impulses and Stochastic Arithmetic for Signal Processing" Proc. 2001 IEEE International Conference on Acoustics, Speech, and Signal Processing, pp. 1257-1260.

Lazar, A. and Toth, L., "Perfect Recovery and Sensitivity Analysis of Time Encoded Bandlimited Signals," IEEE Transactions on Circuits and Systems-I, vol. 51, No. 10, pp. 2060-2073, Oct. 2004.

Ouzounov, S. et al. "Design of High-Performance Asynchronous Sigma Delta Modulators with a Binary Quantizer with Hysteresis", IEEE 2004 Custom Integrated Circuits Conference, 2004, pp. 181-184.

Perrinet, Laurent, "Emergence of filters from natural scenes in a sparse spike coding scheme," 2004, pp. 821-826.

Roza, E., "Analog to Digital Conversion via Duty Cycle Modulation," IEEE Transactions on Circuits and Systems-II, vol. 44, No. 11, pp. 907-914, Nov. 1997.

Walden, R., "Analog to Digital Converter Survey and Analysis", IEEE Journal on Selected Areas in Communication, vol. 17, No. 4, pp. 539-550, Apr. 1999.

Wang, et al. "Review of pulse-coupled neural networks," 2009, pp. 5-13.

Xia, Y. and Wang, J. "A Recurrent Neural Network for Solving Nonlinear Convex Programs Subject to Linear Constraints", IEEE Transactions on Neural Networks, vol. 16, No. 2, Mar. 2005.

PCT Search Report dated Jan. 14, 2013 from PCT/US2012/040043.

PCT Written Opinion dated Jan. 14, 2013 from PCT/US2012/040043.

PCT International Preliminary Report on Patentability dated Dec. 2, 2013 from PCT/US2012/040043.

From U.S. Appl. No. 11/595,107 (now U.S. Pat. No. 7,996,4520), Office Action mailed on Jun. 24, 2010.

From U.S. Appl. No. 11/595,107 (now U.S. Pat. No. 7,996,4520), Office Action mailed on Nov. 29, 2010.

From U.S. Appl. No. 11/595,107 (now U.S. Pat. No. 7,996,4520), Notice of Allowance mailed on Apr. 4, 2011.

From U.S. Appl. No. 11/726,484 (now U.S. Pat. No. 7,515,084), Office Action mailed on May 22, 2008.

From U.S. Appl. No. 11/726,484 (now U.S. Pat. No. 7,515,084), Office Action mailed on Sep. 10, 2008.

From U.S. Appl. No. 11/726,484 (now U.S. Pat. No. 7,515,084), Notice of Allowance mailed on Dec. 2, 2008.

From U.S. Appl. No. 11/726,860 (now published as U.S. Pat. No. 7,822,698), Office Action mailed on Mar. 8, 2010.

From U.S. Appl. No. 11/726,860 (now published as U.S. Pat. No. 7,822,698), Notice of Allowance mailed on Jun. 11, 2010.

From U.S. Appl. No. 12/118,475 (now U.S. Pat. No. 7,592,939), Notice of Allowance mailed on May 22, 2009.

From U.S. Appl. No. 12/262,691 (now U.S. Pat. No. 7,965,216), Office Action mailed on Apr. 7, 2010.

From U.S. Appl. No. 12/262,691 (now U.S. Pat. No. 7,965,216), Office Action mailed on Aug. 23, 2010.

From U.S. Appl. No. 12/262,691 (now U.S. Pat. No. 7,965,216), Notice of Allowance mailed on Feb. 17, 2011.

From U.S. Appl. No. 12/262,782 (now published as U.S. Pat. No. 7,724,168), Notice of Allowance mailed on Jan. 11, 2010.

From U.S. Appl. No. 12/266,299 (now published as U.S. Pat. No. 7,750,835), Notice of Allowance mailed on Mar. 22, 2010.

From U.S. Appl. No. 12/266,299 (now published as U.S. Pat. No. 7,750,835), Notice of Allowance mailed on Jun. 22, 2010.

From U.S. Appl. No. 13/044,922 (U.S. Pat. No. 8,566,265), Notice of Allowance mailed on Jun. 20, 2013.

From U.S. Appl. No. 13/151,763 (now U.S. Pat. No. 8,595,157), Notice of Allowance mailed on Jul. 18, 2013.

From U.S. Appl. No. 14/032,082 (unpublished, non publication request filed), Office Action mailed on Sep. 10, 2014.

* cited by examiner

First stage beamforming chip 100 for four independent beams for the 2 by 4 array

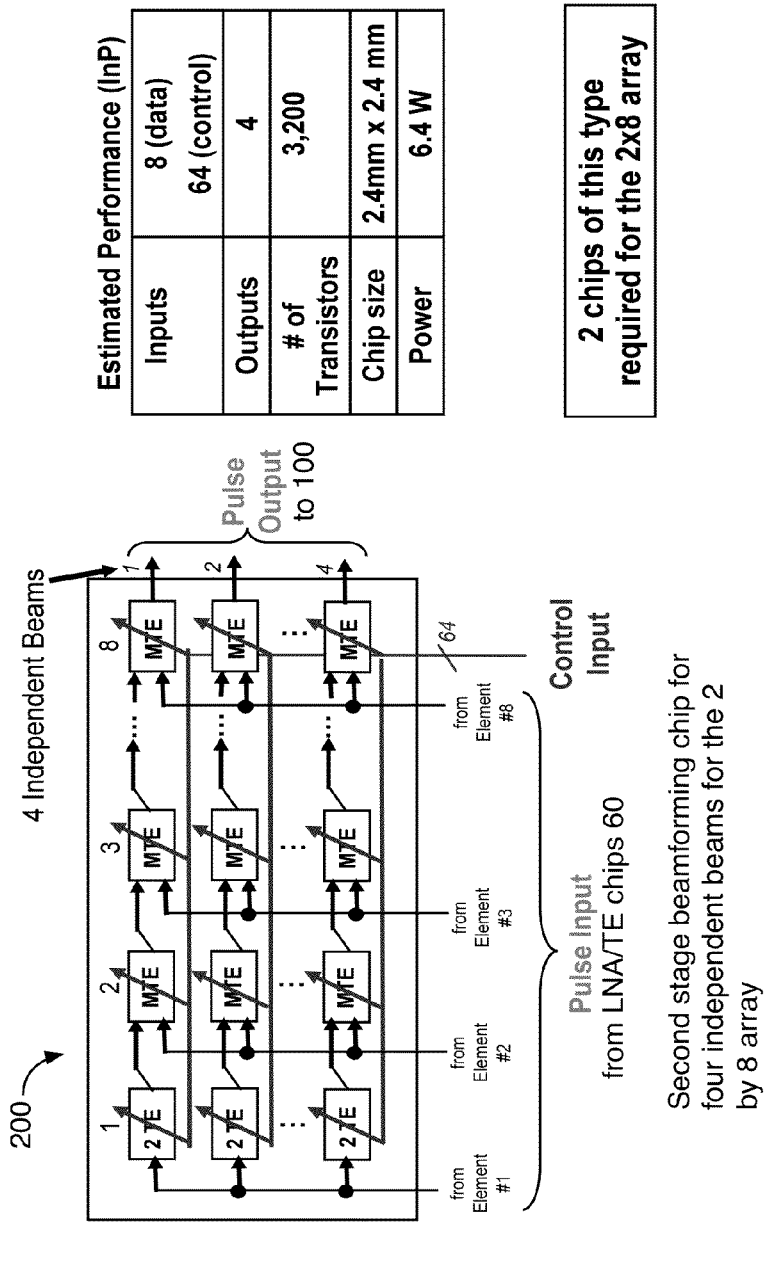

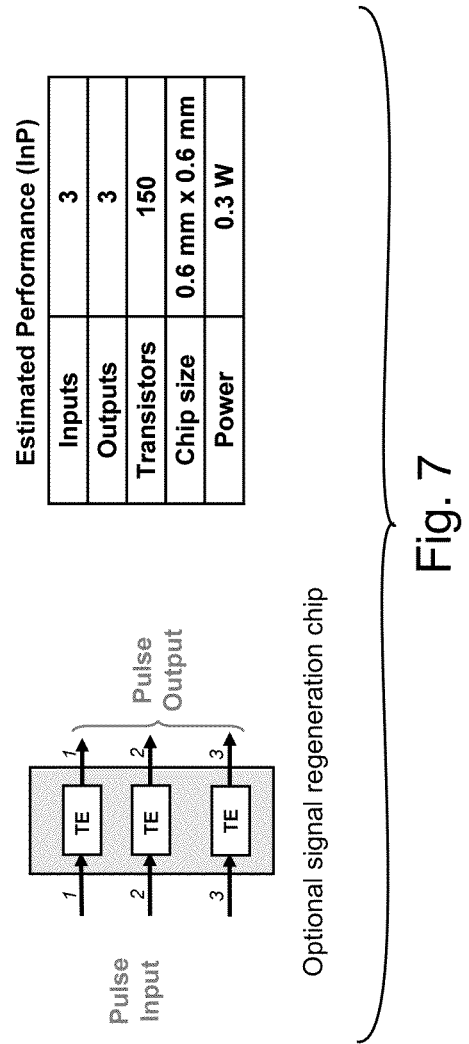

2-by -4 element AESA transmit APP based beamformer

TIME ENCODED CIRCUITS AND METHODS AND A TIME ENCODER BASED BEAMFORMER FOR USE IN RECEIVING AND TRANSMITTING APPLICATIONS

CROSS REFERENCE TO RELATED PATENTS

This application is related to the technology disclosed in U.S. Pat. No. 7,515,084, the disclosure of which is hereby incorporated herein by reference.

STATEMENT REGARDING FEDERAL FUNDING

None.

TECHNICAL FIELD

The invention relates to chip-scale analog beam forming engine for receive and/or transmit Active Electronically Scanned Array (AESA) applications.

BACKGROUND

This invention relates to a novel chip-scale analog beam forming engine for receive array applications consisting of IC chips. The beam forming engine is based upon HRL's Asynchronous Pulse Processor (APP) circuit technology disclosed in U.S. Pat. No. 7,592,939 entitled "Digital domain to pulse domain time encoder" the disclosure of which is hereby incorporated herein by reference. APP involves using Pulse domain processing with time encoders. Pulse processing for other applications is described in other issued US patents assigned to the assignee of the present application, which include: U.S. Pat. Nos. 7,403,144; 7,515,084; 7,724,168; and 7,822,698 for other applications in: frequency filtering (implementing a filter with a given frequency transfer characteristic without beam forming); Analog-to-Digital-Conversion (converting a single analog signal into the digital domain without beam forming); implementation of linear programming circuits (for solving a specific class optimization mathematical problems without beam forming); and implementation of nonlinear processors (for realizing neural networks without beam forming). U.S. Pat. Nos. 7,403,144; 7,515,084; 7,724,168; and 7,822,698 are all incorporated herein by reference, This invention enables ultra wide bandwidth, low cost and low complexity receive Active Electronically Scanned Arrays (AESA) that are not practical using prior art technologies. Key features of proposed APP-based beam forming engine is that it (1) is scalable up to millimeter wave frequencies and up to extremely large size two- and three-dimensional arrays with arbitrary numbers of independent beams, (2) enables ultra wideband operations with wide instantaneous bandwidth, (3) is affordable since it enables potentially low cost RF CMOS, chip-scale highly modular architectures, (4) is easily extendable to transmit arrays, and (5) provides high Dynamic Range (DR) and linearity operation.

Prior art receive AESA technologies include (a) traditional analog beam forming approaches that utilize conventional phase shifting and time delay devices, (b) element level digital beam forming approaches that utilize a high DR and wide bandwidth Analog-to-Digital Converter (ADC) in each antenna element and (c) subarray level digital beam forming approaches that utilize analog beam forming approaches for the subarrays and use only one ADC for each subarray. Comparison of above array technologies along with the disclosed APP based beam forming approach with respect to required control complexity, Spurious Free Dynamic Range (SFDR) of ADCs, dispersion loss and bandwidth are summarized in Table I below:

TABLE I

| ARRAY ARCHITECTURE | CONTROL COMPLEXITY | SFDR & # OF ADCs | DISPERSION LOSS & BANDWIDTH (BW) |
| --- | --- | --- | --- |
| Traditional Analog | Medium | High SFDR Small #of ADCs | High Loss Narrow BW |
| Element Level Digital | High | High SFDR Large #of ADCs (No process gain in SFDR) | High Loss Wide BW |
| Subarray Level Digital | High | High SFDR Medium #of ADCs (No process gain in SFDR) | High Loss Wide BW |

Traditional analog beam forming approaches utilize passive or active phase shifters, photonics beam forming approaches that are based upon photonics true time delay elements i.e., long optical cables distributed across the array, and switched transmission lines.

Passive or active phase shifters are inherently narrowband devices that cannot be used for wide bandwidth operation. Also, they are physically large and lossy devices.

In photonics beam forming approach the RF input signals from the antenna elements first need to be converted into optical signals where the beam forming operation is achieved by the delay operation in the optical cables. Then the time delayed optical signals need to be transformed back from optical to RF and need to be digitized and further processed. The RF-to-optical and optical-to-RF transformations are typically lossy processes that require power hungry optical modulator and demodulator devices. Also, a large number of long and precisely cut optical cables are required to obtain fine granulites in the beam angle resolution. While the photonics beam forming based AESA can have wide operational bandwidth, its complexity for even medium size arrays is prohibitive. The switched transmission lines beam forming approach requires fast, wide bandwidth and low loss switching devices along with wide bandwith, low loss and long transmission lines. Unfortunately, neither reliable switching devices nor low cost low loss transmission line technology exist today. The RF MEMS switch technology that could provide low loss wide bandwidth RF switches is still in its infancy. Superconductor technology could provide low loss wide bandwidth transmission lines but the cost is prohibitive for all practical applications.

Element level digital beam forming approaches of the prior art utilize a high DR and wide bandwidth Analog-to-Digital Converter (ADC) in each antenna element. No wideband and high DR (SFDR) ADCs are known by the inventors hereof to exist which makes that prior art approach impractical. No ADCs are required at the antenna elements of the beamformer of the invention.

SUMMARY OF THE INVENTION

In one aspect the present invention provides a method of delaying a pulse domain signal comprising: applying an inputted pulse domain signal to a time encoder circuit; and controlling an amount of true time delay imposed by said time encoder on said inputted pulse domain signal by controlling the gains of an input transconductance amplifier or 1-bit DAC and a feedback 1-bit DAC in said time encoder.

In another aspect the present invention provides a time encoder circuit which is responsive to a received pulse domain signal and which outputs a true time delayed output signal with the amount of time delay being a function of gains of devices used in said time encoder circuit.

In yet another aspect the present invention provides an apparatus for beam-forming an received incident RF signal comprising a first plurality of time encoders each having inputs for receiving an inputted pulse domain signal, the time encoders imposing a controlled amount of time delay on the inputted pulse domain signal by controlling the gains of an input transconductance amplifier or 1-bit DAC and a feedback 1-bit DAC in each said time encoder, the time encoders being arranged in pairs wherein the gain of a first input transconductance amplifier or 1-bit DAC in a first one of said time encoders in each pair of said time encoders and the gain of a second input transconductance amplifier or 1-bit DAC in a second one of each said time encoders in pair of said time encoders are controlled in common and wherein the gain of a first feedback 1-bit DAC in a first one of said time encoder in each pair of said time encoders and the gain of a second feedback 1-bit DAC in a second one of said time encoder in each pair of said time encoders are controlled in common.

BRIEF DESCRIPTION OF THE DRAWINGS

FIG. 6 depicts the general form of the second stage beam forming chip for use in a receive beamformer;

FIG. 7 is a schematic diagram of an optional signal regeneration chip, while

DETAILED DESCRIPTION

Figure 1:
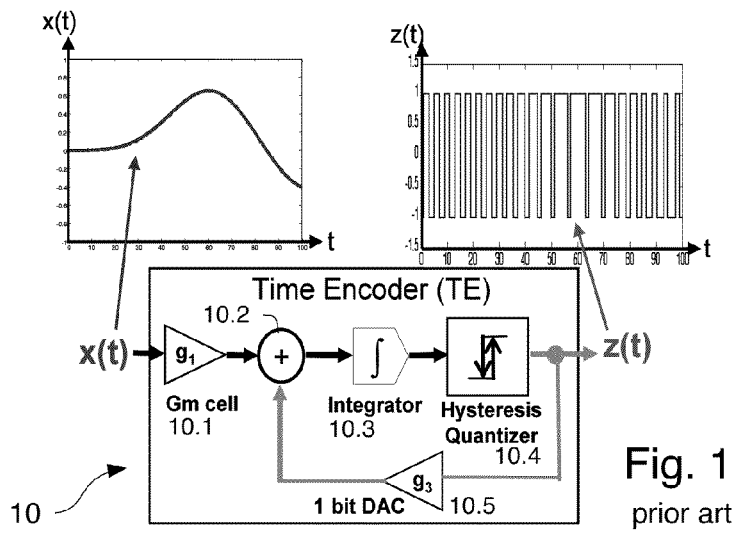
FIG. 1 depicts a prior art time encoder (TE) together exemplary input and output waveforms.

This invention utilizes arrays of time encoders to form both receive and transmit beamformers. A prior art embodiment of a time encoder 10 is now described with reference to FIG. 1. This time encoder is known per se in the prior art. It is modified (see FIG. 2 where the reference number 15 refers to a modified version thereof used in arrays (described below)). In the prior art device of FIG. 1 a continuous-amplitude and continuous-time analog signal x(t) is transformed into the Asynchronous Pulse Domain (APD) using a process called "time encoding." The time-encoding process converts the continuous amplitude and continuous time analog signal x(t) into an asynchronous pulse sequence z(t) as shown in FIG. 1. Preferably, no information is lost in this process and preferably no quantization noise is introduced during the time-encoding process. It has recently been proven (see Lazar, A. A. and Toth, L. T. "Perfect recovery and sensitivity analysis of time encoded bandlimited signals", *IEEE Transactions on Circuits and Systems I*, vol. 51, no. 10, pp, 2060-2073, October 2004) that any band-limited signal can perfectly be recovered from the resulting asynchronous pulse sequence. The circuit that implements the time-encoding transformation is called a time encoder and an embodiment of same appears as element 10 in FIG. 1. The prior art time encoder 10 consists of an input trans conductance amplifier or 1-bit DAC 10.1, a feedback 1-bit DAC 10.5, an integrator 10.3, a hysteresis quantizer 10.4, and a summing junction 10.2. The time encoder of FIG. 1 is driven by an analog input signal x(t) and an exemplary analog input waveform x(t) is depicted; the time encoder of FIG. 1 generates an output pulse domain signal z(t). An exemplary output pulse domain signal z(t) which corresponds to the depicted exemplary analog input signal x(t) is also depicted in FIG. 1.

Figure 2:
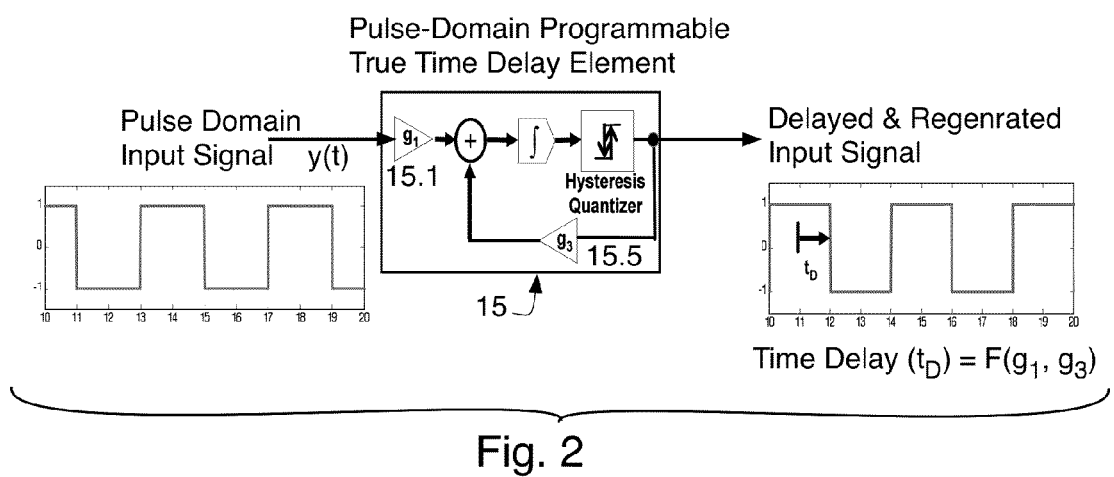
FIG. 2 depicts the TE of FIG. 1a implementing a Pulse Domain Programmable True Time Delay Element.

An important circuit component of disclosed beamformers is a programmable Pulse Domain True Time Delay (PDTTD) circuit element 15 of FIG. 2 which is the modified time encoder referred to in the preceding paragraph. A programmable PDTTD 15 can be implemented using the prior art circuit of FIG. 1 by driving the circuit with a pulse domain input signal (as opposed to an analog signal as done in the prior art) and by making the gains g1 and g3 of prior art DACs 10.1 and 10.5 adjustable (identified with the numbers 15.1 and 15.5 in FIG. 2). The delay of the PDTTD circuit of FIG. 2 is increased by decreasing the gains of both g1 and g3. The basic idea behind the PDTTD circuit element depicted in FIG. 2 may be summarized as follows: if the modified time encoder (modified TE or PDTTD) 15 is driven by a time-encoded signal (asynchronous pulse sequence) y(t) instead of an analog one x(t) (as done in the prior art time encoder 10), the PDTTD 15 regenerates the pulse sequence with a time delay that depends upon (is a function of) the values of the input and feedback 1-bit DACs 15.1 and 15.5. The strict theory behind this simple operation is quite complex and based on the general theories of consistent signal reconstruction and signals with finite rate of innovations. In spite of the fact that the underlying theories are complex, the practical implementation of a pulse domain delay element modfied as such (a PDTTD) is very simple and straightforward. The minimum delay, which is always larger than zero, depends on the maximum gains of the 1-bit input and feedback DACs 15.1 and 15.5. The maximum delay depends on the zero-encoding pulse rate and modulation depth of the PDTTD 15; lower pulse rates and smaller modulation depths translate to larger achievable delays. The maximum pulse rate is usually determined by the circuit technology (~32 GHz in InP) and fully controllable from DC up to the maximum pulse rate by the actual circuit parameter settings (the weight of the 1-bit feedback DAC 15.5, hysteresis width, etc.). The modulation depth is fully controllable by the remaining free circuit parameters (weight of the 1-bit input DAC 15.1, etc.) and mainly determined by the required Dynamic Range (DR). The trade off between noise floor, DR, pulse rate and modulation depth can easily be established via simulation results.

Figure 2A:
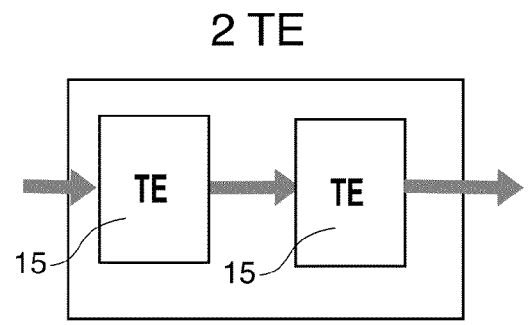
FIGS. 2a and 2b depict the TE of FIG. 2 arranged in pairs (FIG. 2a) and with multiple inputs (FIG. 2b)
Figure 2B:
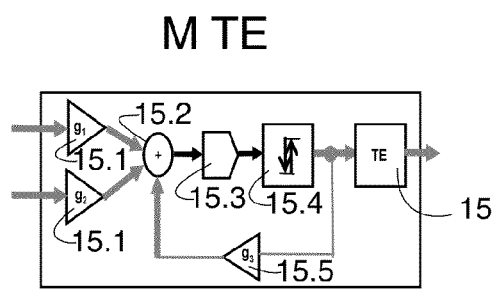

The PDTTDs 15 are preferably utilized in cascaded pairs as shown in FIGS. 2a and 2b. In FIG. 2a a pair of PDTTDs 15 are cascaded with the output of a first one of the pair coupled to the input of a second one of the pair. A pair of cascaded modified time encoders in accordance with FIG. 2a are referred to by the nomenclature "2 TE" in subsequent figures and description. The modified TEs or PDTTDs 15 are cascaded as shown in FIG. 2a to increase the range of the possible delay compared to a single PDTTD 15. The control signals for g1 and g3 in each PDTTDs 15 in the pair (2 TE) are each preferably connected in common. A chain of two modified TEs (2 TE) is useful in providing maximum delays that are comparable to the Nyquist period (inverse of Nyquist frequency) of the highest frequency components of the input signals. Longer chains of modified TEs 15 may be used to achieve even larger delays, if desired. In FIG. 2b a pair of modified time encoders 15 are cascaded with the output of a first one of the pair again coupled to the input of a second one of the pair. But in this embodiment, the first time encoder has multiple input DACs 15.1 and this arrangement is sometimes called a "MTE" herein. The gm for the two depicted input 1-bit DACs of the MTE are gm1 and gm2, which are preferably independently controllable. The control voltages for g1, g2 and g3 are preferably not connected in common in the case of a MTE configuration. The second modified TE 15 shown in the MTE of FIG. 2b is sometimes referred to as a backend TE herein. The integrator 15.3, the hysteresis quantizer 15.4, and the summing junction 15.2 may be the same as found in a prior art TE 10.

Receive Beamformer

Figure 3:
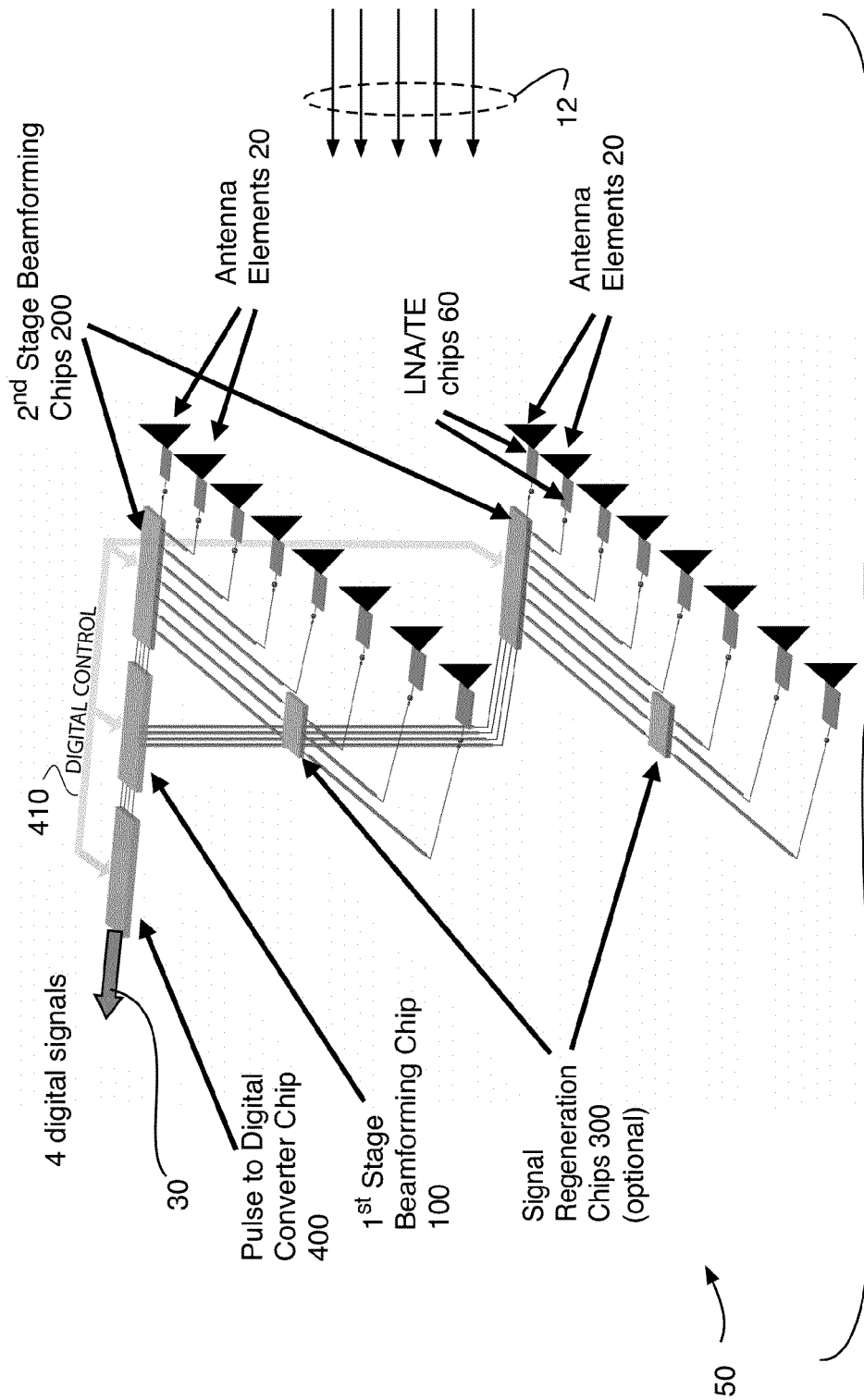
FIG. 3 is a block diagram (in a three dimensional format) of a 2-by-4 element AESA receive embodiment of disclosed APP-based beamformer.

An embodiment of a receive beamformer in accordance with the present invention is depicted by FIG. 3. The embodiment of receive beamformer array 50 of FIG. 3 provides a 2-by-8 element AESA which is used with and coupled to a 2-by-8 array of receive antenna elements 20. The size of the array, 2-by-8, in this embodiment is selected merely for the ease of illustration and explanation. Typical arrays used in actual applications would mostly likely be considerably larger. So the size of the disclosed 2-by-8 element array is selected merely to convey the novel features of this technology to the reader and is not intended to limit the size of actual arrays made in accordance with this invention in any way.

Figure 4:
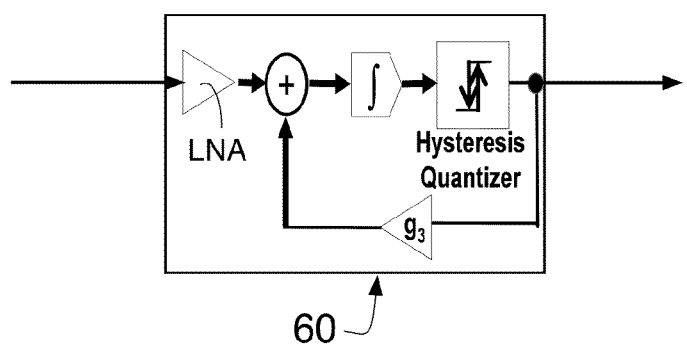
FIG. 4 depicts an embodiment of the LNA/TE of FIG. 3.
Figure 7A:
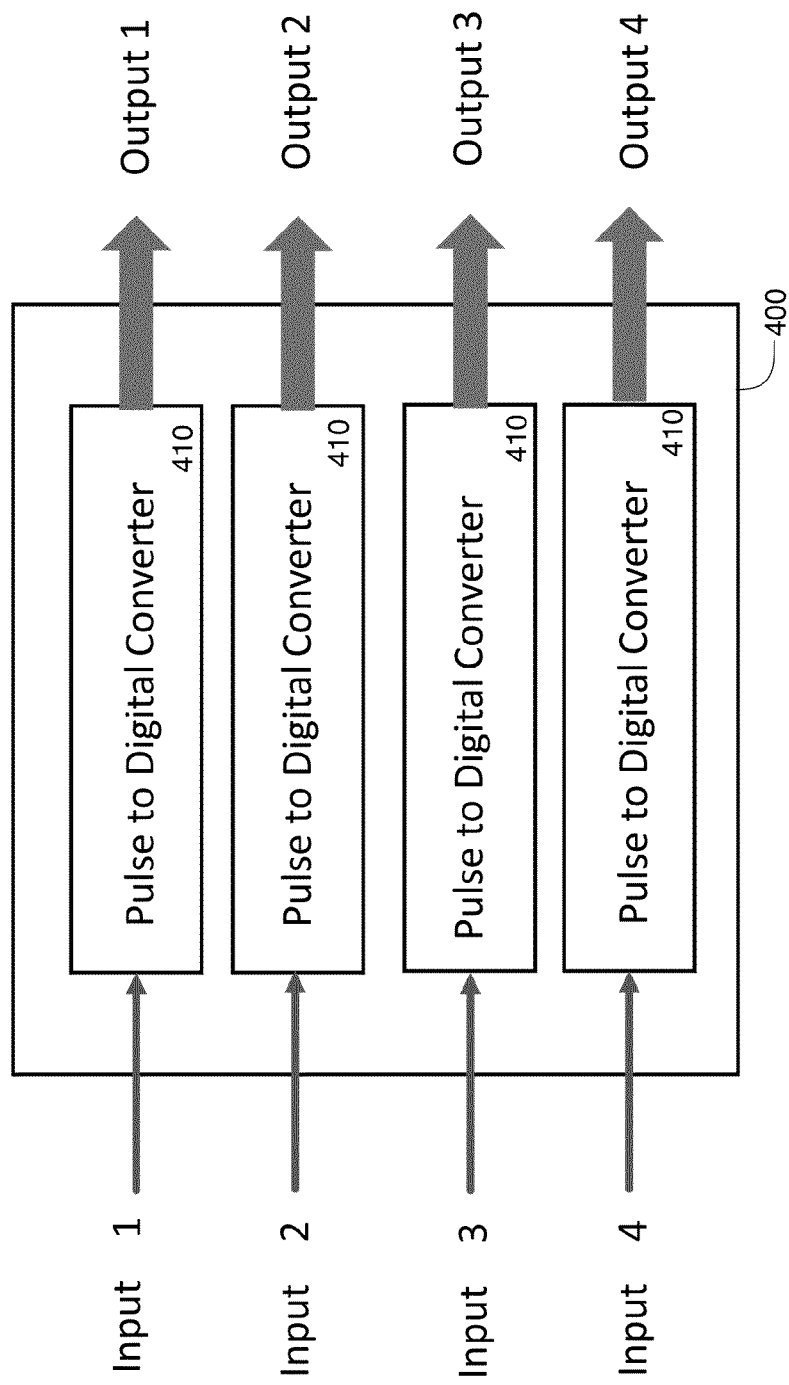
FIG. 7(a) is a block diagram of an optional unit comprising four pulse to digital converter circuits which are in turn depicted by FIG. 7(b)

In FIG. 3, the disclosed receive beamformer array 50 includes a first-stage beam forming chip 100 (see FIG. 5), two second-stage beam forming chips 200 (see FIG. 6), sixteen Low Noise Amplifiers (LNAs) and Time Encoding (TE) circuit chips 60 (see FIG. 4), various RF/analog signal distribution lines, two optional signal regeneration chips 300 (see FIG. 7), an optional pulse-to-digital converter block 400 preferably containing four pulse to digital convertor circuits 410 (see FIG. 7(a)), one circuit 410 for each of the four inputs and outputs in this embodiment, and digital control lines 410. The set of analog chips (chips 100, 200, optionally 300 and 400), excluding the LNA/TE circuits 60, collectively form what is called the beam forming engine herein. The LNA/TE circuits 60 (see FIG. 4) are similar to the TE 10 of FIG. 1 but the transconductance amplifier g1 of FIG. 1 is replaced by a Low Noise Amplifier or LNA) to first amplify and then time encode the incoming RF signals 12 received at each antenna element 10. In this stage of processing the input RF signals 12 are transformed (by the time encoders in the LNA/TE circuits 60) into analog asynchronous pulse sequences that are fed into the second-stage beam forming chips 200, preferably row-by-row. That is to say, more than one independent second-stage beam forming chip 200 is preferably associated with each row of antenna elements 20. Some of all of the analog asynchronous pulse sequences provided at the outputs of the LNA/TE circuits 60 may be fed via optional signal regeneration circuits 300 to the second-stage beam forming chips 200.

Perhaps an explanation of the nomenclature used here might to useful for the reader. The reader has probably noted that the incoming signal first goes to a second stage chip 200 which outputs to a first stage chip 100. The first stage chip 100 is called "first" simply because it is closer (signal-wise) to a downstream digital processor (not shown) than are the second stage chips 200.

At the outputs of the second-stage beam forming chips 200 four independent beams are formed by time delaying and combining the incoming RF signals from each antenna element 20 according to the row delay requirements needed for spaced antenna elements along a horizontal direction as shown in FIG. 3. The number (four) of beams at the outputs of chips 200 can be changed if desired—the number four was selected since it seems to be a reasonable number given the amount of circuity need on a single chip 200 to implement four beams. In the first-stage beam forming chip 100, the input signals are further time delayed, weighted, and combined according to the column delay requirements needed for spaced antenna elements 20 along a vertical direction as shown in FIG. 3. These chips (the two chips 200 and the single chip 100) provide the time-encoded versions of the combined RF/analog input signals from each antenna element 20 forming (in this case four) independent beams in the pulse domain. The pulse-to-digital converter 400 converts the four asynchronous pulse sequences from chip 100 into signals 30 in the digital domain for further processing by a downstream CPU.

Important features of this AESA receive technology are that it: 1) provides a digital representation of high Dynamic Range and linearity output signal per beam; 2) is relatively low cost since it enables potentially low-cost SiGe/CMOS, chip-scale highly modular architectures; 3) is easily scalable up to millimeter-wave frequencies using existing integrated circuit technologies and up to extremely large two-dimensional arrays (similar circuitry could be used to implement three-dimensional arrays—the two and three dimensional array may have arbitrary numbers of independent beams); 4) enables ultra-wideband operations with wide instantaneous bandwidth; and 5) is extendable to transmit arrays (which arrays are discussed below).

An important component of disclosed ultra-wideband, chip-scale analog beam forming engine is a small set of unit element-based mixed-signal (SiGe BiCMOS or InP, for example) chips utilizing modified TEs 15 as depicted by FIG.

2. The APP based beamforming engine chips implement a novel signal-processing concept which we call Asynchronous Pulse Processing. The circuit that implements this processing scheme is called an Asynchronous Pulse Domain Processor (APDP).

The APDP can effectively implement advanced signal-processing algorithms where the signal amplitude is kept discrete, usually binary, and the time is continuous. The two salient features of the APDP-based approach are that it overcomes the limitations of 1) voltage resolution of analog signals in deep-submicron processes (transistors having gate dimensions much less than a micron) and 2) the programmability of traditional analog processors.

It is to be noted that disclosed ultra-wideband, chip-scale analog beam forming engine utilizes a set of modified TEs 15 which are used in various ways and sometimes modified (as in element 60), but which can be implemented, for example, as relatively inexpensive SiGe BiCMOS chips or as more expensive, but faster, InP chips.

Figure 5:
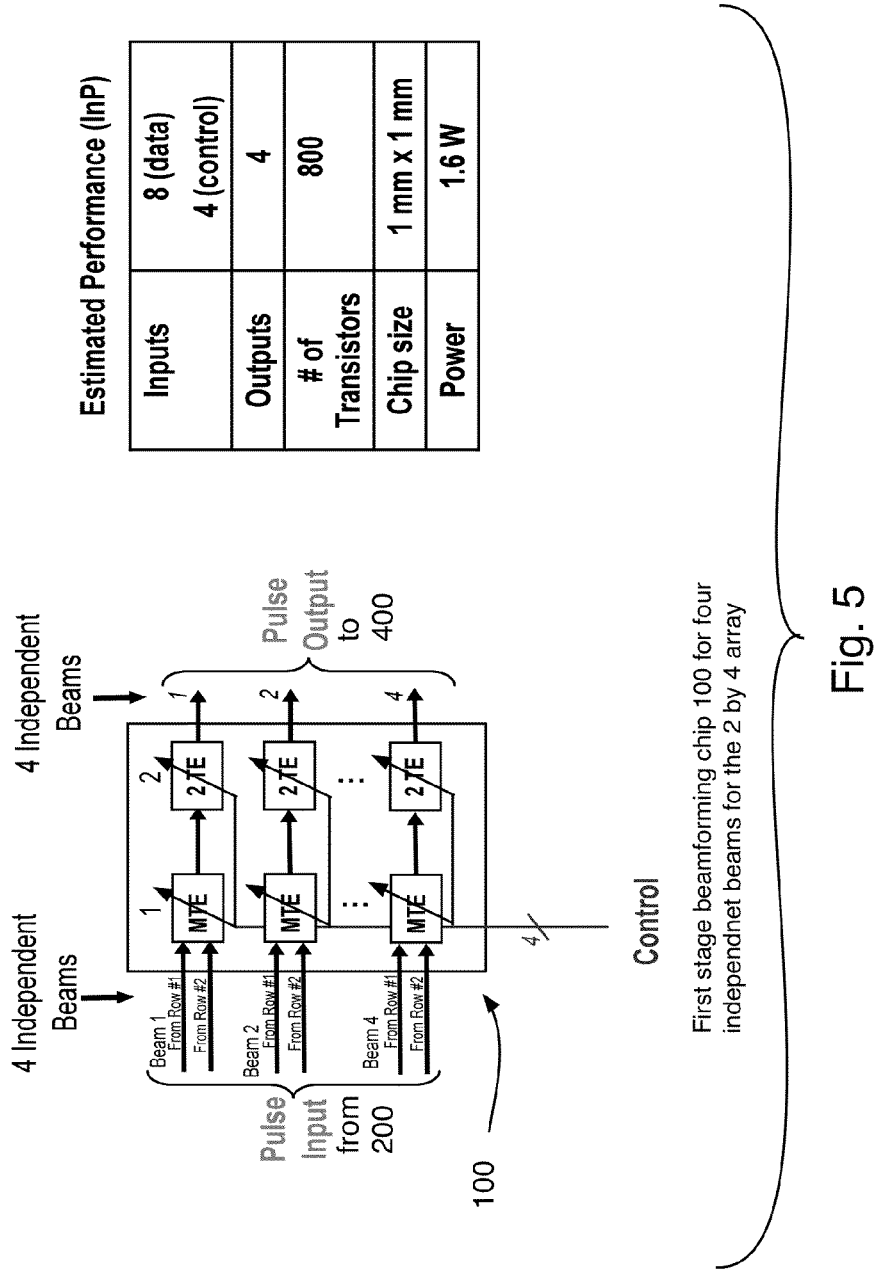
FIG. 5 depicts the general form of the first stage beam forming chip for use in a receive beamformer.

FIG. 5 shows the general form of the first-stage beam forming chip 100 capable of processing and partially forming (performing column delays of beams) the 4 (in this example) independent beams simultaneously. The chip consists of a modular array of cascaded sub-blocks (each comprising two TE circuits 10), which are easily parallelizable and cascadable. One sub-block is labeled 2TE is it comprises two cascaded TE circuits 10 as described above with reference to FIG. 2a. The two cascaded TEs (labeled 2TE) have four possible control signals (see FIG. 2a) associated with the two 1-DACs controlling gains g1 (of the two DACs 10.1) and controlling the gains g3 (of the two DACs 10.5)—in this embodiment preferably the g1 and g3 gains of the 1-bit DACs in the pair of TEs (labeled 2TE) are all controlled by a single gain control signal, so in this embodiment these four 1-bit DACs all preferably share a common gain value. Another sub-block is labeled MTE is it comprises two cascaded TE circuits 10, but the first TE in this block accepts multiple inputs and thus has multiple input 1-bit DACs 10.1 as described above with reference to FIG. 2b. In this embodiment preferably three gain control signals are used to control the gains of the 1-bit DACs in the MTE. One is used for the front-end g1 1-bit DAC of FIG. 2b, another for the front-end g2 1-bit DAC of FIG. 2b, and another is used for controlling the g3 1-bit DAC and the two internal 1-bit DACs of the back-end TE 10. Chip 100 can be scaled for a larger number of components, if desired. The chips can also be segmented into identical, smaller size and lower complexity chips with smaller physical sizes and fewer numbers of I/Os, if desired. Individual chip size and complexity can be used as optimization parameters to achieve target life-cycle cost reduction. Performance estimates of a particular InP first-stage beam forming chip capable of processing four independent beams for the 2-by-8 element array are also shown in FIG. 5. Other semiconductor technologies, including InP, GeSi BiCMOS and others, can be used if desired. For GeSi BiCMOS the chip size and power will be similar or lower than for InP, thus GeSi BiCMOS is the currently preferred semiconductor technology to use in implementing these integrated circuits or chips.

Only one First Stage Receive Beam Forming Chip 100 is required for the 2 by 8 array of FIG. 3. In actual practice, the array would typically be larger than 2 by 8 so either more chips 100 and/or more complex versions of chip 100 (the more complex versions of chip 100 supporting more than four inputs and outputs) would be used.

FIG. 6 shows the general form of the second-stage beam forming chip 200 capable of processing and partially forming (performing weighting and element delays of beams) the four (in this embodiment) independent beams simultaneously. The chip consists of a modular array of the TE and MTE sub-blocks described above with reference to FIGS. 2a and 2b (four 2 TE elements and 28 2-input MTEs, which are easily parallelizable and cascadable. Each MTE receives two control lines. One controls gain g3 (of both the element g3 of FIG. 2b and also the element g3 of the TE 15 inside the MTE) and the other controls g1 of the modified TE 15 inside the MTE. Each 2TE receive two control lines. One control line sets the gain g1 (of both its two internal modified TEs 15) and the other controls the gain g3 (of both of its two internal modified TEs 15).

FIG. 3 shows the digital control signals which originate at a computer or CPU (not shown) and which go to chips 100 and 200 and possibly also chip 400 as depicted. The signals going into chips 100 and 200 contain the gains of certain elements inside the chips that need to be adjusted during beam forming (such as gains of 1-bit DACs 15.1 and 15.1 inside the 2TE and MTE blocks of the chips). Typically each gain is encoded by a digital word (typically 8 bits). Each control line in FIGS. 5 and 6 transmits the information of one digital word. Potentially control signals connected to chip 400 can be used to adjust the speed of the pulse-to-digital converter. Chip 200 can also be segmented into identical, smaller or larger size and smaller or larger complexity chips of arbitrary size and greater or fewer numbers of I/Os. Individual chip size and complexity can be used as optimization parameters to achieve target life-cycle cost reduction. Performance estimates of a particular SiGe second-stage beam forming chip capable of processing four independent beams for the 2-by-8 element array are also shown in FIG. 6.

FIG. 7 shows the optional signal regeneration chip 300 that consists of modified TE circuits 15. This chip regenerates the incoming asynchronous pulses. Also, it applies small fixed delays to them. These small delays are compensated in a similar way as those of the fixed RF lines shown in FIG. 5. The MTE and 2TE blocks inside chips 200 and 400 have a programmable delay as previously discussed. One portion of the delay of these MTE and 2TE elements is used to compensate the delay introduced the fixed RF lines and by the regeneration chips. Another portion of the delay of these MTE and 2TE elements is used to adjust the relative timing of signals coming from different antenna elements to produce different beam formings.

Figure 7B:
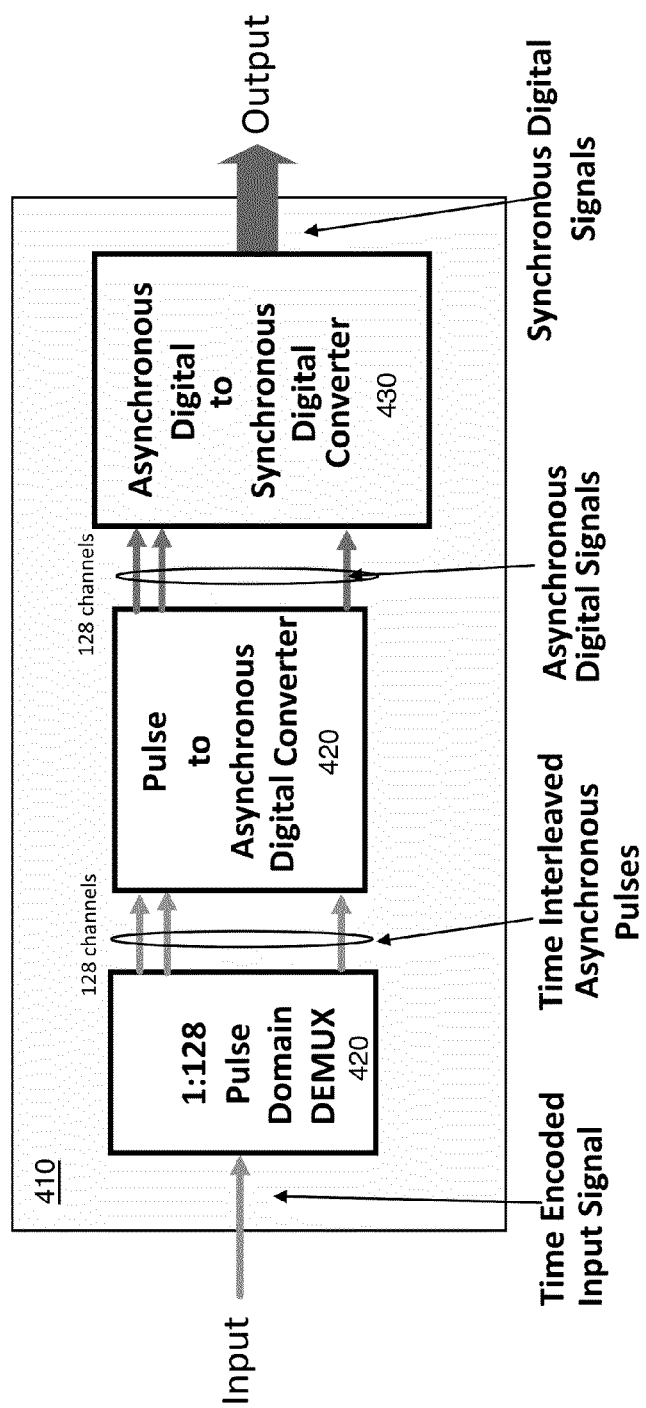

FIG. 7(a) depicts block 400 having four pulse to digital converter circuits 410. The number of circuits 410 in block 400 can be modified depending on the number of different signals received from different beams. This should match the number of output channels of the beamformer chip of FIG. 5. Block 400 and its circuits 410 are optional since the downstream processing of the received signals might be done in the pulse domain as opposed to the digital domain in which case block 400 and its circuits 410 are not used. Circuit 410 depicted in FIG. 7(b) is somewhat similar to FIG. 1 of U.S. Pat. No. 7,515,084 (block 102 of FIG. 1 of U.S. Pat. No. 7,515,084 being omitted). Block 420 of FIG. 7(b) corresponds to block 104 of U.S. Pat. No. 7,515,084 and therefore for a better understanding of block 420 please see the discussion of block 104 in U.S. Pat. No. 7,515,084. Block 430 of FIG. 7b basically corresponds to block 106 of U.S. Pat. No. 7,515,084 and therefore for a better understanding of block 430 please see the discussion of block 106 in U.S. Pat. No. 7,515,084. Finally, block 440 of FIG. 7(b) basically corresponds to block 108 of U.S. Pat. No. 7,515,084 and therefore for a better understanding of block 440 please see the discussion of block 108 in U.S. Pat. No. 7,515,084.

Transmit Beamformer

Figure 8:
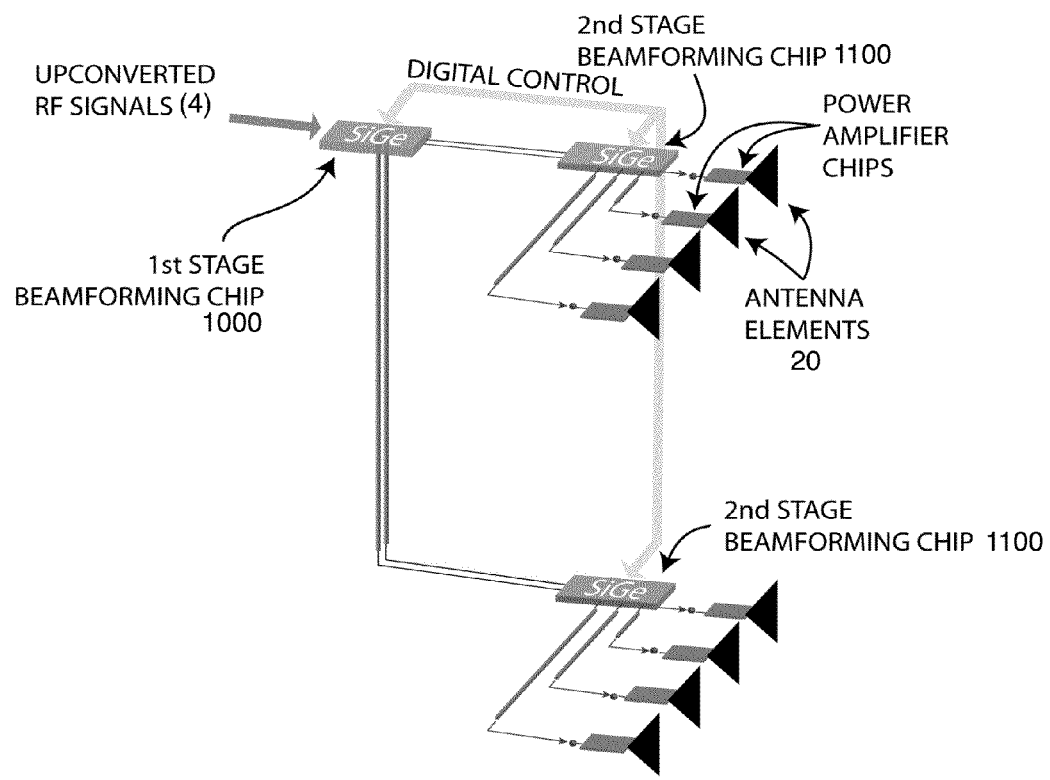
FIG. 8 is a block diagram (in a three dimensional format) of a 2-by-4 element AESA transmit embodiment of disclosed APP-based beamformer.

Three-dimensional rendering of a 2-by-4 element AESA transmit embodiment of disclosed APP-based beamformer is shown in FIG. 8. This embodiment consists of a first-stage SiGe beam forming chip 1000, two second-stage SiGe beam forming chips 1100, eight GaN switch mode Power Amplifier (PA) chips 1200 each one preferably containing a high-power passive bandpass filter (not shown), RF/analog signal distribution lines, and digital control lines which preferably originate from the aforementioned digital processor or CPU (not shown) which is used to control the amount of beaming forming etc. The digital control signals generated by this digital processor or CPU are applied to chips 1000 and 1100 to control the gains of certain elements inside the chips that need to be adjusted during beam forming (such as gains of 1-bit DACs 15.1 and 15.5 inside the 2TE and MTE blocks of the chips). The set of analog chips, excluding the PAs 1200, may be collectively called the transmit beam forming engine. The two up-converted RF/analog signals, via the time encoding process, are first transformed into two analog asynchronous pulse sequences in the input stage of the first-stage beam forming chip 1000. In the output stage of the first-stage beam forming chip, the two time-encoded RF/analog signals are independently time delayed according to the column delay requirements. In the two second-stage beam forming chips 1100, the input signals are further time delayed, weighted, and combined according to the row delay requirements. These chips provide the time-encoded versions of the combined RF/analog input signals to each antenna element. The switch mode GaN PAs 1200 amplify the time-encoded combined RF/analog signals and deliver them via the high-power passive bandpass filters to the antenna elements 20. Important features of the this novel AESA transmit technology are that it: 1) provides high-power output per element with high "wall-plug" efficiency; 2) is affordable since it enables potentially low-cost SiGe/CMOS, chip-scale highly modular architectures; 3) is scalable up to millimeter-wave frequencies and up to extremely large two- and three-dimensional arrays with arbitrary numbers of independent beams; 4) enables ultra-wideband operations with wide instantaneous bandwidth; and 5) is easily extendable to receive arrays.

Antenna elements 20 shown in FIG. 8 may be the same antenna elements as shown in FIG. 3 (with suitable switching elements added so that the elements 20 are coupled to the LNA/TE elements 60 when in a receive mode of operation and to PAs 70 when in a transmit mode of operation). Alternatively, the antenna elements 20 of FIG. 3 may a different set of antenna elements than the antenna elements 20 of FIG. 8 in which case the set of antenna elements of FIG. 3 can be dedicated to receive operations and the set of antenna elements of FIG. 8 can be dedicated to transmit operations.

Figure 9:
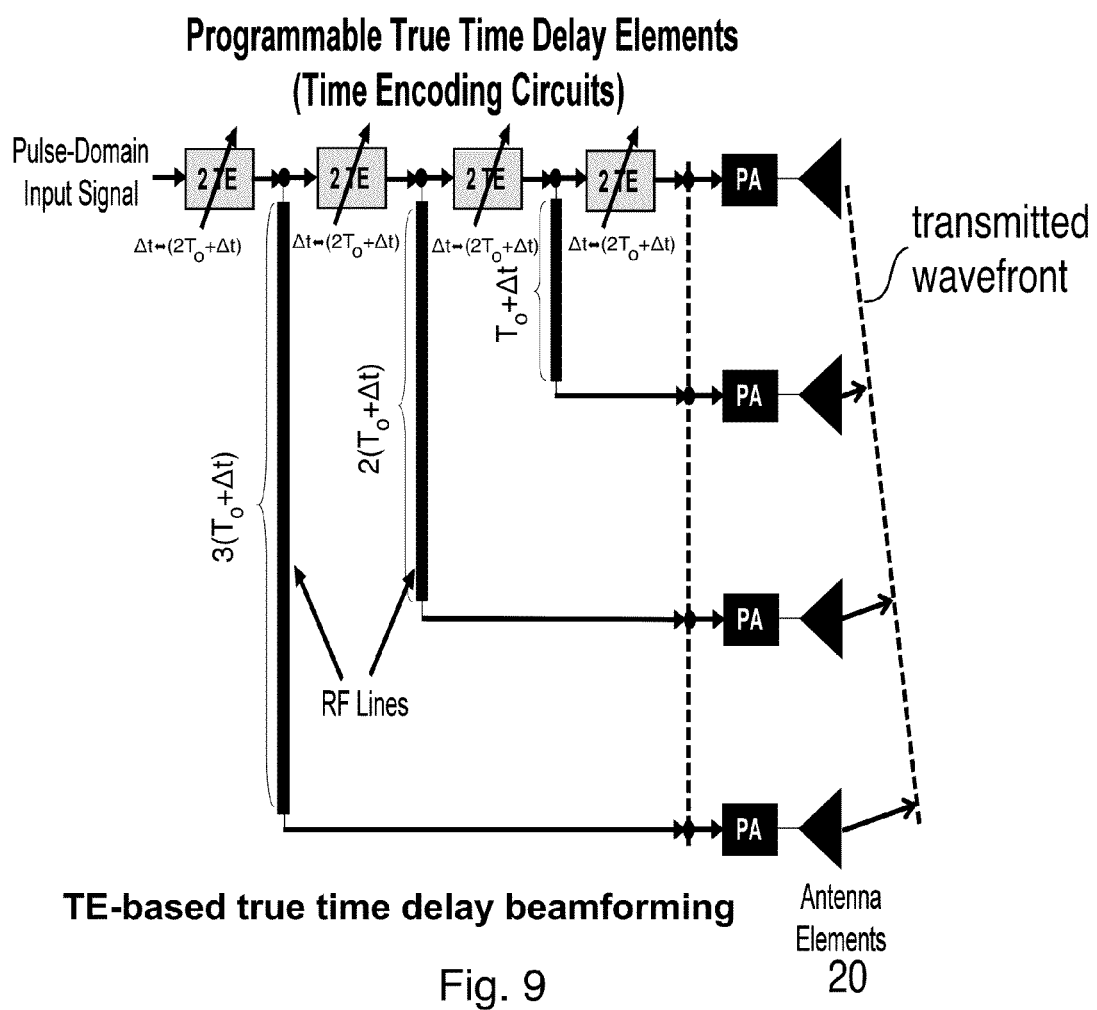
FIG. 9 is a diagram showing how to use programmable time delay elements to achieve true time delay-based beam forming for a simple four-element transmit linear array.

FIG. 9 shows how to use programmable time delay elements to achieve true time delay-based beam forming for a simple four-element transmit linear array. First assume that the time delay unit $T_0$ is determined by the free-space time delay between neighboring antenna elements 20. Next assume that the highest frequency of operation is 16 GHz and the antenna elements 20 are located half wavelength apart. In this case $T_0$=31.25 ps. To achieve full scanning (|scanning angle|<90°) one needs to be able to set |Dt|<31.25 ps time delay between neighboring antenna elements 20. If we use a moderate speed TE circuit with a pulse rate of ~22 GHz, the maximum achievable time delay is around 22 ps. With a modulation depth of 20%, the achievable maximum time delay is around 18 ps. With two cascaded TEs, indicated as 2 TEs (see FIG. 2a and the related description above for an explanation of an individual "2 TE") in each time delay element in FIG. 9, one easily can achieve the required 31.25 ps time delay. The beam forming circuit control is quite simple. One needs to set up (by adjusting the weights of the 1-bit input and feedback DACs) the proper time delay between dt and (2 $T_0$+dt) where dt is the minimum achievable time delay with two TEs. With the disclosed beam forming concept combined element level amplitude and delay control can easily be achieved.

Figure 10:
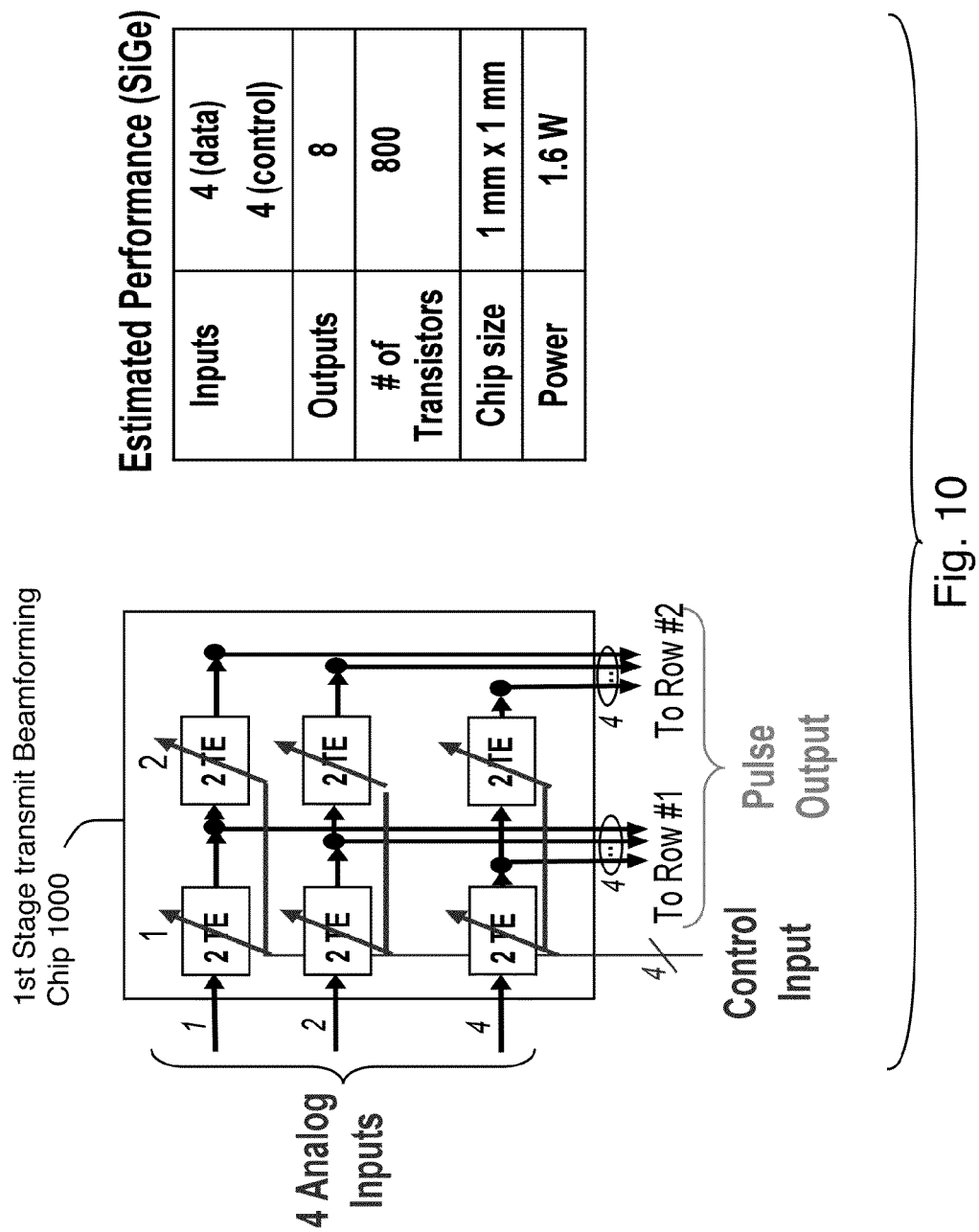
FIG. 10 shows the general form of the first stage beam forming chip for the AESA transmit embodiment of disclosed APP-based beamformer.

FIG. 10 shows the general form of the first-stage beam forming chip 1000 capable of processing and partially forming (performing column delays of beams) the four (in this example) independent beams simultaneously. Chip 1000 consists of a modular array of four cascaded 2TEs (see FIG. 2a), which are easily parallelizable and cascade-able. This chip can be segmented into identical, smaller size and complexity chips with arbitrary size and number of I/Os. Individual chip size and complexity can be used as optimization parameters to achieve target life-cycle cost reduction. Performance estimates of a particular SiGe first-stage beam forming chip capable of processing four independent beams for the 2-by-4 element array embodiment are also shown in FIG. 10. The four analog inputs in FIG. 10 are the four upconverted RF signals of FIG. 8.

Figure 11:
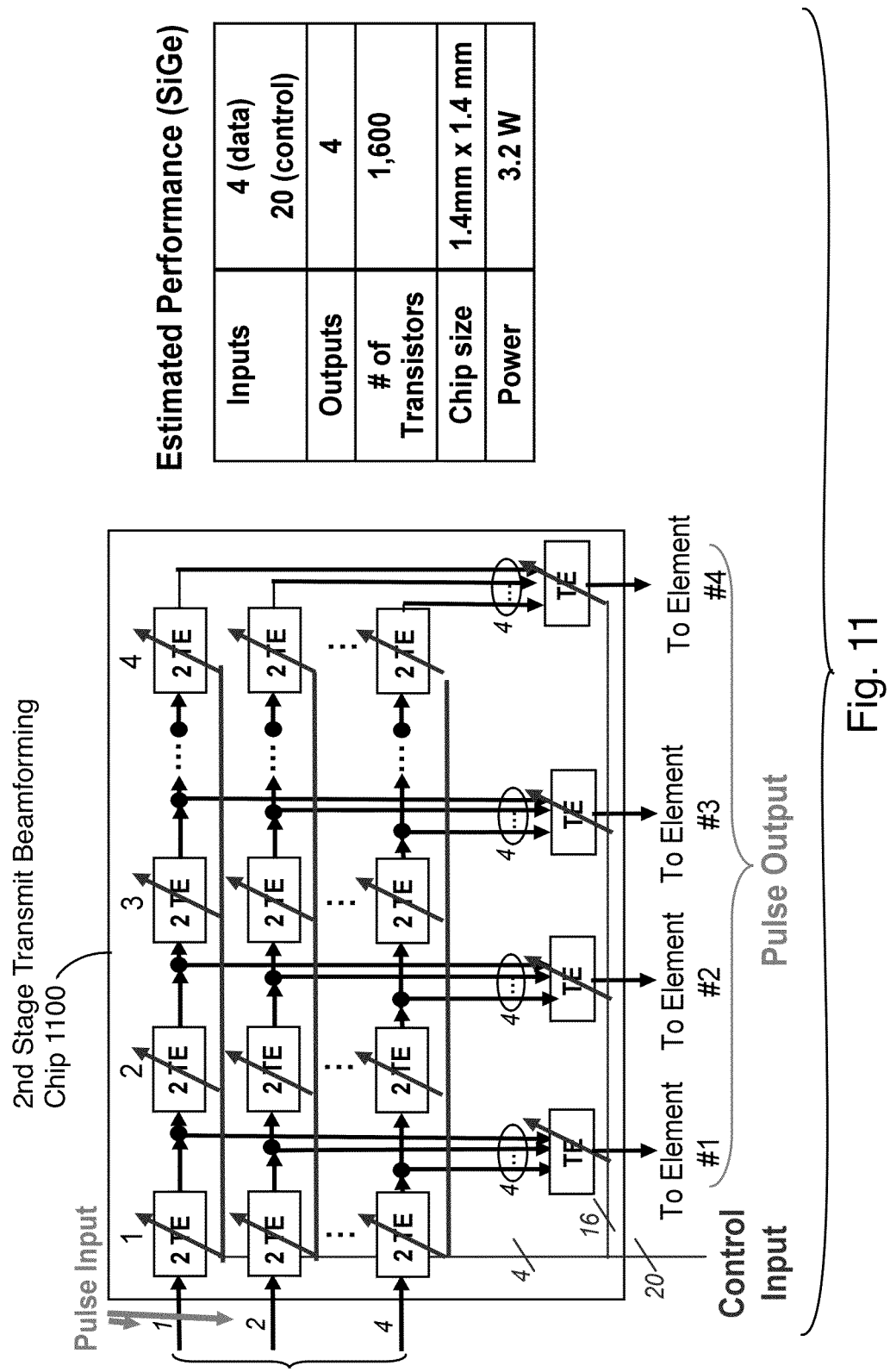
FIG. 11 shows the general form of the second stage beam forming chip for the AESA transmit embodiment of disclosed APP-based beamformer.

FIG. 11 shows the general form of the second-stage beam forming chip 1100 capable of processing and partially forming (performing weighting and element delays of beams) the four (in this example) independent beams simultaneously. Each chip 1200 (two are used in the embodiment of FIG. 8) consists of a modular array of: 16 2-TE blocks (each one as described in FIG. 2a) and four additional modified TE blocks shown at the bottom of FIG. 11 (each one labeled as TE 15 but receiving four inputs). These additional blocks are multiple-input modified time encoders 15, similar to that shown in FIG. 2b, but with four inputs (and thus four 1-bit DACs 15.5) instead than two and with the second modified TE 15 shown in FIG. 2b preferably omitted.

Appendix A depicts a simulation and the simulation results of a behavioral simulation of a time encoded based transmit beamformer of the invention with just four antenna elements 20. Part A of Appendix A shows the circuit model. It consists of the circuit of FIG. 9 plus interface circuitry to convert signals to and from the pulse domain. For this simulation we used a single input signal. This input signal is a 3-tone signal (containing 3 frequency components). The circuit model has 4 outputs. Each output is intended to produce a version of the input with different amount of delays, without distorting the shape of the signal. Parts Bm C and D show three different simulations presented as graphs.

The top graph (Minimum delay: 3.275 ps per TE) of Appendix A shows the case in which the TEs are programmed to have a small delay (3.275 ps in the simulation). The four outputs (Labeled as signal 1 to signal 4 in the figure) have identical shape, showing no distortion of the signal, as desired. The four outputs are relatively shifted in time, with the signal 1 ahead of signal 2, the signal 2 ahead of signal 3, and the signal 3 ahead of signal 4. This is what is desired to steer the beam to the left.

The middle graph (Mid delay: 11.087 ps per TE) of Appendix A shows the case in which the TEs are programmed to have a medium delay (11.087 ps in the simulation). The four outputs (Labeled as signal 1 to signal 4 in the figure) have identical shape, showing no distortion of the signal, as desired. The four outputs are not shifted in time, with the signals 1, 2, 3 and 4 all coincident. This is what is desired to steer the beam to the front.

The bottom graph (Maximum delay: 18.9 ps per TE) of Appendix A shows the case in which the TEs are programmed to have a large delay (18.9 ps in the simulation). The four outputs (Labeled as signal 1 to signal 4 in the figure) have identical shape, showing no distortion of the signal, as desired. The four outputs are relatively shifted in time, with the signal 1 behind of signal 2, the signal 2 behind of signal 3, and the signal 3 behind of signal 4. This is what is desired to steer the beam to the right.

Modifications

The antenna arrays in both the receive and transmit embodiments is presented as a 2 row by 8 antenna element array. Those skilled in this art will be able to scale the designs presented into much larger arrays and also into single row arrays as needed in particular applications. Of course, the number of 2TE and MTE circuits will need to grow as needed with larger arrays of antenna elements. The level of integration can also be modified as desired. For example, one first stage chip 100 and two second stage chips 200 are shown as supporting a 2 row by 8 antenna element array. But those skilled in the art well realize that these three chips could all be integrated together as a single SiGe/CMOS or InP chip and/or that other chip chemistries that the two suggested herein may be used as needed or desired. So the number of chips used in practicing this invention can vary widely depending on the size of the antenna array and the complexity (level of integration) of the resulting chip or chips.

Having described the invention in connection with certain embodiments thereof, modification will now suggest itself to those skilled in the art. As such, the invention is not to be limited to the disclosed embodiment except as is specifically required by the appended claims.

What is claimed is:

1. A method of delaying a pulse domain signal comprising:
   a. applying an inputted pulse domain signal to a time encoder circuit; and
   b. controlling an amount of true time delay imposed by said time encoder on said inputted pulse domain signal by controlling the gains of an input transconductance amplifier or 1-bit Digital to Analog Converter (DAC) and a feedback 1-bit DAC in said time encoder.

2. The method of claim 1 wherein said time encoder comprises:
   a. said input transconductance amplifier or 1-bit DAC having an input coupled to receive said inputted pulse domain signal;
   b. a summing junction with two inputs and one output, one input of the summing junction being coupled to an output of said input transconductance amplifier or 1-bit DAC,
   c. an integrator having an input and an output, the input of the integrator being coupled to the output of the summing junction;
   d. a hysteresis quantizer having an input and an output, the input of the hysteresis quantizer being coupled to the output of the integrator; and
   e. said feedback 1-bit DAC having an input and an output, the input of the feedback 1-bit DAC being coupled to the output of the hysteresis quantizer, the output of the feedback 1-bit DAC being coupled to an other input of the summing junction, the output of the hysteresis quantizer serving as an output where the inputted pulse signal which has been delayed by controlling the gains of said input transconductance amplifier or 1-bit DAC and said feedback 1-bit DAC in said time encoder can be obtained.

3. A method of beam-forming received incident Radio Frequency (RF) signal comprising arranging a first plurality of said time encoders, each preforming the method of claim 1, in pairs wherein the gain of a first input transconductance amplifier or 1-bit DAC in a first one of said time encoders in each pair of said time encoders and the gain of a second input transconductance amplifier or 1-bit DAC in a second one of said time encoders in each pair of said time encoders are controlled in common and wherein the gain of a first feedback 1-bit DAC in a first one of said time encoder, in each, pair of said time encoders and the gain of a second feedback 1-bit DAC in a second one of said time encoders in each pair of said time encoders are controlled in common.

4. The method of beam-forming a received incident RF signal of claim 3 further comprising arranging a second plurality of said time encoders in pairs wherein the first time encoder in each pair has a plurality of inputs and a corresponding number of first input transconductance amplifiers or 1-bit DACs coupled to said plurality of inputs.

5. The method of beam-forming a received incident RF signal of claim 4 further comprising arranging a first subset of said second plurality of said time encoders connected in a paired relationship with a first subset of said first plurality of said time encoders to thereby define at least one first stage receive beaming forming circuit or chip, wherein the first time encoder in each paired relationship has a first one of its plurality of inputs coupled to a first row antenna elements in a beaming forming array received at least via one or more second stage receive beaming forming circuits or chips, with second one of its plurality of inputs coupled to a second row of antenna elements in said beaming forming array received via at least said one of more second stage receive beaming forming circuits or chips, and continuing until all of said plurality of inputs are coupled to a unique row or column of said beaming forming array received via said one or more second stage receive beaming forming circuits or chips.

6. The method of beam-forming a received incident RF signal of claim 5 further comprising arranging each of the one or more second stage receive beaming forming circuits or chips to include a two dimensional array comprising a second subset of said first plurality of said time encoders arranged in a first column of said two dimensional array and a second subset of said second plurality of said time encoders disposed in other columns of said array, signals derived from a first antenna element in a first row in said beaming forming array providing inputs in the second subset of said first plurality of said time encoders and the outputs of the second subset of said first plurality of said time encoders being applied to one of the inputs of the second subset of said second plurality of said time encoders disposed in a second column of said array with A signal for the other input of the second subset of said second plurality of said time encoders disposed in the second column of said array being derived from a second antenna element in the first row in said beaming forming array, and the outputs of the second subset of said second plurality of said time encoders disposed in the first column being applied to one of the inputs of the second subset of said second plurality of said time encoders disposed in a third column of said array with a signal for the other input of the second subset of said second plurality of said time encoders disposed in the third column of said array being derived from a third antenna element in the first row in said beaming forming array, and continuing until all antenna elements in said first row in said beaming forming array are coupled with said two dimensional array.

7. The method of beam-forming a received incident RF signal of claim 6 wherein the method of claim 6 is repeated with additional second stage receive beam forming circuits or chips, as needed, to couple additional rows beyond said first row of antenna elements with one of more of said two dimensional arrays in one or more second stage receive beam forming circuits or chips.

8. The method of beam-forming an received incident RF signal of claim 7 wherein a direction of beam-forming is controlled changing controlling the amount of true time delay imposed by said time encoders.

9. The method of beam-forming a received incident RF signal of claim 8 further including coupling said antenna elements to said one or more second stage receive beam forming circuits or chips via at least a Low Noise Amplifier/Time Encoder (LNA/TE) circuit associated with each antenna elements in said beaming forming array, each said LNA/TE circuit comprising:
  a. a Low Noise Amplifier (LNA) having an input coupled to one of said antenna elements in said beaming forming array comprising;
  b. a summing junction with two inputs and one output, one input of the summing junction being coupled to an output of said LNA,
  c. an integrator having an input and an output, the input of the integrator being coupled to the output of the summing junction;
  d. a hysteresis quantizer having an input and an output, the input of the hysteresis quantizer being coupled to the output of the integrator; and
  e. a feedback 1-bit DAC having an input and an output, the input of the feedback 1-bit DAC being coupled to the output of the hysteresis quantizer, the output of the feedback 1-bit DAC being coupled to an other input of the summing junction.

10. A method of beam-forming a transmitted Radio Frequency (RF) signal from a beam forming array comprising arranging a first plurality of said time encoders preforming the method of claim 1 in pairs wherein the gain of a first input transconductance amplifier or 1-bit Digital to Analog Converter (DAC) in a first one of said time encoders in each pair of said time encoders and the gain of a second input transconductance amplifier or 1-bit DAC in a second one of said time encoders in each pair of said time encoders are controlled in common and wherein the gain of a first feedback 1-bit DAC in a first one of said time encoders in each pair of said time encoders and the gain of a second feedback 1-bit DAC in a second one of said time encoders in each pair of said time encoders are controlled in common.

11. The method of beam-forming a transmitted RF signal of claim 10 further comprising arranging a second plurality of said time encoders in pairs wherein the first time encoder in each pair has a plurality of inputs and a corresponding number of first input transconductance amplifiers or 1-bit DACs coupled to said plurality of inputs.

12. The method of claim 11 further comprising arranging a first subset of said first plurality of said time encoders connected in an paired relationship with another subset of said first plurality of said time encoders to thereby define at least one first stage transmit beaming forming circuit or chip, wherein the input of first time encoder in each pair receiving a RF signal to be transmitted and the output of second time encoder in each pair.

13. An apparatus for beam-forming an received incident Radio Frequency (RF) signal comprising a first plurality of time encoders each having inputs for receiving an inputted pulse domain signal, the time encoders imposing a controlled amount of time delay on the inputted pulse domain signal by controlling the gains of an input transconductance amplifier or 1-bit Digital to Analog Converter (DAC), and a feedback 1-bit DAC in each said time encoder, the time encoders being arranged in pairs wherein the gain of a first input transconductance amplifier or 1-bit DAC in a first one of said time encoders in each pair of said time encoders and the gain of a second input transconductance amplifier or 1-bit DAC in a second one of said time encoders in each pair of said time encoders are controlled in common and wherein the gain of a first feedback 1-bit DAC in a first one of said time encodes in each pair of said time encoders and the gain of a second feedback 1-bit DAC in a second one of said time encoders in each pair of said time encoders are controlled in common.

14. The apparatus of claim 13 further including a second plurality of said time encoders arranged in series-connected pairs wherein the first time encoder in each series-connected pair has a plurality of inputs and a corresponding number of first input transconductance amplifiers or 1-bit DACs coupled to said plurality of inputs.

15. The apparatus of claim 14 wherein a first subset of said second plurality of said time encoders are connected in a paired relationship with a first subset of said first plurality of said time encoders to thereby define at least one first stage receive beaming forming circuit or chip, wherein the first time encoder in each paired relationship has a first one of said plurality of inputs coupled to a first row antenna elements in a beaming forming array received at least via one or more second stage receive beaming forming circuits or chips, with second one of said plurality of inputs coupled to a second row of antenna elements in said beaming forming array received via at least said one of more second stage receive beaming forming circuits or chips, and continuing until all of said plurality of inputs are coupled to a unique row or column of said beaming forming array received via said one or more second stage receive beaming forming circuits or chips.

16. The apparatus of claim 15 wherein the one or more second stage receive beam forming circuits or chips are arranged to include a two dimensional array comprising a second subset of said first plurality of said time encoders arranged in a first column of said two dimensional array and a second subset of said second plurality of said time encoders disposed in other columns of said array, signals derived from a first antenna element in a first row in said beaming forming array providing inputs in the second subset of said first plurality of said time encoders and the outputs of the second subset of said first plurality of said time encoders being applied to one of the inputs of the second subset of said second plurality of said time encoders disposed in a second column of said array with A signal for the other input of the second subset of said second plurality of said time encoders disposed in a second column of said array being derived from a second antenna element in the first row in said beaming forming array, and the outputs of the second subset of said second plurality of said time encoders disposed in the first column being applied to one of the inputs of the second subset of said second plurality of said time encoders disposed in a third column of said array with signal for the other input of the second subset of said second plurality of said time encoders disposed in a third column of said array being derived from a third antenna element in the first row in said beaming forming array, and continuing until all antenna elements in said first row in said beaming forming array are coupled with said two dimensional array.

17. The apparatus of claim 16 wherein the apparatus of claim 16 is repeated with additional second stage receive beam forming circuits or chips, as needed, to couple additional rows beyond said first row of antenna elements with one of more of said two dimensional arrays in one or more second stage receive beam forming circuits or chips.

18. The apparatus of claim 17 wherein a direction of beamforming is controlled by changing controlling the amount of true time delay imposed by said time encoders.

19. The apparatus of claim 18 wherein said antenna elements are coupled to said one or more second stage receive beam forming circuits or chips via at least a Low Noise Amplifier/Time Encoder (LNA/TE) circuit associated with each antenna elements in said beaming forming array, each said LNA/TE circuit comprising:
   a. a Low Noise Amplifier (LNA) having an input coupled to one of said antenna elements in said beaming forming array comprising;
   b. a summing junction with two inputs and one output, one input of the summing junction being coupled to an output of said LNA,
   c. an integrator having an input and an output, the input of the integrator being coupled to the output of the summing junction;
   d. a hysteresis quantizer having an input and an output, the input of the hysteresis quantizer being coupled to the output of the integrator; and
   e. a feedback 1-bit DAC having an input and an output, the input of the feedback 1-bit DAC being coupled to the output of the hysteresis quantizer, the output of the feedback 1-bit DAC being coupled to an other input of the summing junction.

* * * * *